US010935606B2

(12) United States Patent
Takatsuka et al.

(10) Patent No.: US 10,935,606 B2
(45) Date of Patent: Mar. 2, 2021

(54) EXCESS/DEFICIENCY DETERMINATION DEVICE, METHOD FOR CONTROLLING SAME, CONTROL PROGRAM, AND RECORDING MEDIUM

(71) Applicant: OMRON Corporation, Kyoto (JP)

(72) Inventors: Hiromasa Takatsuka, Kyoto (JP); Kazuki Kasai, Kyoto (JP); Taiji Yoshikawa, Kyoto (JP)

(73) Assignee: Omron Corporation, Kyoto (JP)

( * ) Notice: Subject to any disclaimer, the term of this patent is extended or adjusted under 35 U.S.C. 154(b) by 329 days.

(21) Appl. No.: 15/554,954

(22) PCT Filed: Jan. 14, 2016

(86) PCT No.: PCT/JP2016/051040
§ 371 (c)(1),
(2) Date: Aug. 31, 2017

(87) PCT Pub. No.: WO2016/143384
PCT Pub. Date: Sep. 15, 2016

(65) Prior Publication Data
US 2018/0045786 A1  Feb. 15, 2018

(30) Foreign Application Priority Data

Mar. 12, 2015 (JP) .............................. JP2015-049614

(51) Int. Cl.
*G01R 31/36* (2020.01)
*G06Q 30/06* (2012.01)
(Continued)

(52) U.S. Cl.
CPC ....... *G01R 31/367* (2019.01); *G01R 31/3647* (2019.01); *G01R 31/392* (2019.01);
(Continued)

(58) Field of Classification Search
CPC ................ G01R 31/392; G01R 31/367; G06Q 30/0645; G06Q 10/087; G06Q 10/06315;
(Continued)

(56) References Cited

U.S. PATENT DOCUMENTS

| 6,014,597 A * | 1/2000 | Kochanneck ............ B60K 1/04 |
| | | 701/22 |
| 2003/0169019 A1 * | 9/2003 | Oosaki .................. H02J 7/0047 |
| | | 320/132 |

(Continued)

FOREIGN PATENT DOCUMENTS

| JP | H11-98699 A | 4/1999 |
| JP | 2012-006591 A | 1/2012 |

(Continued)

OTHER PUBLICATIONS

International Search Report issued in PCT/JP2016/051040 dated Mar. 15, 2016 (2 pages).

(Continued)

*Primary Examiner* — John E Breene
*Assistant Examiner* — Jeffrey P Aiello
(74) *Attorney, Agent, or Firm* — Osha Bergman Watanabe & Burton LLP

(57) ABSTRACT

A supply amount change prediction component takes into account a decrease in full-charge capacity due to battery deterioration to predict a future amount of power supplied by a plurality of batteries, and a surplus calculator calculates the surplus of the power supply amount with respect to the power demand.

9 Claims, 7 Drawing Sheets

(51) Int. Cl.
*H02J 7/00* (2006.01)
*G01R 31/367* (2019.01)
*G01R 31/392* (2019.01)

(52) U.S. Cl.
CPC ............ *G06Q 30/0645* (2013.01); *H02J 7/00* (2013.01); *H02J 7/007* (2013.01); *H02J 7/0063* (2013.01); *H02J 7/0068* (2013.01); *H02J 2007/0067* (2013.01)

(58) Field of Classification Search
CPC ............ H02J 2007/0067; H02J 7/0068; H02J 7/0027; H02J 7/0063; H02J 7/007; B60L 58/12; B60L 53/68; B60L 53/80; H01M 10/625; B60S 5/06
USPC ........ 320/131, 134; 340/636.1; 702/63, 127, 702/178, 187
See application file for complete search history.

(56) References Cited

U.S. PATENT DOCUMENTS

| | | | |
|---|---|---|---|
| 2003/0209375 A1* | 11/2003 | Suzuki | B60K 1/04 180/65.22 |
| 2004/0185913 A1* | 9/2004 | Aoshima | H01M 10/48 455/566 |
| 2009/0027056 A1 | 1/2009 | Huang et al. | |
| 2010/0072954 A1* | 3/2010 | Kohn | H02J 7/0091 320/152 |
| 2011/0040666 A1* | 2/2011 | Crabtree | G06Q 30/0283 705/37 |
| 2011/0148424 A1 | 6/2011 | Chiang et al. | |
| 2012/0150464 A1 | 6/2012 | Swanton | |
| 2014/0312915 A1* | 10/2014 | Mukaitani | H02J 7/007 324/434 |
| 2015/0094968 A1* | 4/2015 | Jia | G06Q 40/04 702/60 |
| 2015/0121113 A1* | 4/2015 | Ramamurthy | H02J 9/061 713/340 |

FOREIGN PATENT DOCUMENTS

| | | |
|---|---|---|
| JP | 2013-090344 A | 5/2013 |
| JP | 2013-090360 A | 5/2013 |
| TW | 201122523 A | 7/2011 |
| TW | 201226952 A | 7/2012 |
| TW | 201346303 A | 11/2013 |
| WO | 2013/080211 A1 | 6/2013 |

OTHER PUBLICATIONS

Office Action issued in corresponding Taiwanese application No. 105101946, dated Feb. 17, 2017 (11 pages).
Search Report issued in European Application No. 16761356.1, dated Mar. 27, 2018 (7 pages).

\* cited by examiner

| BATTERY ID | RATING | SOH (DEC.) | SOH (NOV.) | SOH (OCT.) | SOH (SEP.) | ... |
|---|---|---|---|---|---|---|
| 1 | 1kWh | 73% (0.73kWh) | 75% (0.75kWh) | 77% (0.77kWh) | 79% (0.79kWh) | ... |
| 2 | 2kWh | 65% (1.3kWh) | 67% (1.34kWh) | 69% (1.38kWh) | 71% (1.42kWh) | ... |
| 3 | 2kWh | 95% (1.9kWh) | 96% (1.92kWh) | 97% (1.94kWh) | 98% (1.96kWh) | ... |
| TOTAL SUPPLY AMOUNT | 5kWh | 3.93kWh | 4.01kWh | 4.09kWh | 4.17kWh | ... |

EXAMPLE OF BATTERY DATA

FIG. 2

| BATTERY ID | | LATEST | LAST TIME | TWO TIMES AGO | THREE TIMES AGO | ... |
|---|---|---|---|---|---|---|
| 1 | LOAN DATE AND TIME | 11/02 20:34 | 11/01 09:03 | 10/28 18:39 | 10/15 10:00 | ... |
| | RETURN DATE AND TIME POWER USAGE | 11/03 12:40 2000Wh | 11/01 18:32 3000Wh | 10/30 18:40 1000Wh | 10/16 09:19 2000Wh | ... |
| 2 | LOAN DATE AND TIME | 10/25 14:55 | 10/15 11:00 | 10/8 08:30 | 10/5 15:34 | ... |
| | RETURN DATE AND TIME POWER USAGE | 10/27 08:50 1500Wh | 10/15 18:02 1000Wh | 10/10 15:24 500Wh | 10/7 07:43 1000Wh | ... |
| 3 | LOAN DATE AND TIME | 11/03 10:28 | 11/02 10:01 | 11/01 09:17 | 10/31 10:23 | ... |
| | RETURN DATE AND TIME POWER USAGE | 11/03 12:30 1000Wh | 11/02 18:31 2000Wh | 11/02 00:20 1000Wh | 10/31 19:17 1500Wh | ... |
| ... | | ... | ... | ... | ... | ... |

EXAMPLE OF LOAN/RETURN DATE AND TIME DATA

EXAMPLE OF POWER SUPPLY AMOUNT s

EXAMPLE OF POWER DEMAND f (a)

CALCULATION OF CHANGE OVER TIME FUNCTION h (b)

CALCULATION OF SEASONAL FLUCTUATION FUNCTION g

EXCESS/DEFICIENCY DETERMINATION DEVICE, METHOD FOR CONTROLLING SAME, CONTROL PROGRAM, AND RECORDING MEDIUM

CROSS-REFERENCE TO RELATED APPLICATIONS

This application claims the benefit of Japanese Application No. JP2015-049614, filed Mar. 12, 2015 and International Application PCT/JP2016/051040, filed Jan. 14, 2016, both of which are incorporated herein by reference in their entirety.

TECHNICAL FIELD

The present invention generally relates to an excess/deficiency determination device, a method for controlling this device, a control program, and a recording medium, and relates, for example, to an excess/deficiency determination device that predicts the power supply amount of a plurality of batteries loaned out by a battery swap system.

BACKGROUND

Conventionally, batteries (so-called secondary cells) have been used as a power supply source for an electric car. The battery needs to be charged with the required power by the time of its use. In view of this, Patent Literature 1 discusses a charging control device that adjusts the battery charging speed and charge amount according to information such as the remaining capacity of the battery, the destination of the next trip, and the scheduled departure time on the next trip. The invention discussed in Patent Literature 1 assumes a case in which a single battery is used by one user.

Recent years have seen the advent of a system for loaning out a plurality of batteries to users of electric cars. This system is called a battery swap system because it exchanges (swaps) a returned battery with a charged battery when the used battery is returned from the user of the system (see Patent Literature 2, for example).

CITATION LIST

Patent Literature

Patent Literature 1: Japanese Laid-Open Patent Application 2013-90360 (disclosed on May 13, 2013)
Patent Literature 2: Japanese Laid-Open Patent Application 2012-6591 (disclosed on Jan. 12, 2012)

SUMMARY

The power supply amount that can be provided by the battery swap system may correspond to the power demand from the users of the battery swap system.

However, the power supply amount is the sum of the full-charge capacity (the capacity when a battery has been fully charged) of all the batteries that are loaned out by the battery swap system. Therefore, the power supply amount decreases as the full-charge capacity of the batteries deteriorates due to an increase in the number of times of use or aging. Also, power demand usually fluctuates (increases or decreases) depending on the season and the age of a battery. Therefore, it can be difficult to provide a power supply amount that corresponds to the power demand in a battery swap system.

One or more embodiments of the invention provide an excess/deficiency determination device that makes it possible for a battery swap system to provide a power supply amount that is neither too high nor too low with respect to the power demand.

In one or more embodiments, the excess/deficiency determination device pertaining to the present invention is an excess/deficiency determination device that performs excess/deficiency determination in a system for managing and loaning out a plurality of batteries, about an amount of power that can be supplied by the plurality of batteries managed by the system, the excess/deficiency determination device comprising a demand prediction component, a supply amount prediction component, and an excess/deficiency determination prediction component. The demand prediction component predict a power demand from a current time until a specific period of time later by using information indicating a usage history of each battery. The supply amount prediction component predicts the amount of power that can be supplied by the batteries from a current time until a specific period of time later, from a change in the full-charge capacity of each battery based on a deterioration of each battery, or from a change in the total full-charge capacity of the plurality of batteries based on the deterioration of each battery. The excess/deficiency determination prediction component determines whether there is an excess or a deficiency in the amount of power that can be supplied as predicted by the supply amount prediction component, with respect to the power demand predicted by the demand prediction component, between the current time and a specific period of time later.

Also, in one or more embodiments of the control method pertaining to the present invention is a method for controlling an excess/deficiency determination device that performs excess/deficiency determination in a system for managing and loaning out a plurality of batteries, about an amount of power that can be supplied by the plurality of batteries managed by the system, the method comprising a demand prediction step, a supply amount prediction step, and an excess/deficiency determination prediction step. The demand prediction step involves predicting the power demand from a current time until a specific period of time later by using information indicating a usage history of each battery. The supply amount prediction step involves predicting the amount of power that can be supplied by the batteries from the current time until a specific period of time later, from a change in the full-charge capacity of each battery based on a deterioration of each battery, or from a change in the total full-charge capacity of the plurality of batteries based on the deterioration of each battery. The excess/deficiency determination prediction step involves determining whether there is an excess or a deficiency in the amount of power that can be supplied as predicted in the supply amount prediction step, with respect to the power demand predicted in the demand prediction step, between the current time and a specific period of time later.

With this configuration, it is determined whether there is an excess of a deficiency in the amount of power supplied by a plurality of batteries in the future (between the current time and a specific period of time later) (the amount of power that can be supplied in the future), on the basis of the result of the power supply and demand prediction (that is, the future power demand and the power supply amount). Also, the future power supply amount is predicted from the change in the total full-charge capacity of the plurality of batteries based on the deterioration of the batteries. Accordingly, the future power supply amount by the plurality of batteries is accurately calculated. Therefore, it is accurately predicted whether or not there is an excess or a deficiency in the future power supply amount.

Advantageously, batteries loaned out by the system can be added or replaced in order to meet the future power demand, for example.

With the excess/deficiency determination device pertaining to one or more embodiments of the present invention, information is presented suggesting that the power supply amount be reduced when the excess/deficiency determination prediction component has determined that there is an excess of power that can be supplied between the current time until a specific period of time later. On the other hand, an information presentation component may be further provided so that when the excess/deficiency determination prediction component has determined that the amount of power that can be supplied in the future is insufficient between the current time and a specific period of time later, information is presented suggesting that the power supply amount be increased.

With this configuration, when there is an excess of the power supply amount in the future (between the current time and a specific period of time later), the user can check the presented suggestion and reduce the power supply amount. This eliminates the excessive power supply amount in the future. Also, if the power supply amount in the future is deficient, the user can check the presented suggestion and increase the power supply amount. This eliminates the deficient power supply amount in the future.

With the excess/deficiency determination device pertaining to one or more embodiments of the present invention, the excess/deficiency determination prediction component may further determine whether or not the current power supply amount is excessive with respect to the current power demand, and if the current power supply amount is determined to be excessive, the information presentation component may present information suggesting that the power supply amount be reduced.

With this configuration, if the current power supply amount is excessive, the user can check the presented suggestion and reduce the power supply amount.

With the excess/deficiency determination device pertaining to one or more embodiments of the present invention, the excess/deficiency determination prediction component may further determine whether or not the power supply amount will be deficient between the current time and a specific period of time later when the current power supply amount has been determined to be excessive, and if it is determined that the current power supply amount is excessive and that the power supply amount will be deficient between the current time and a specific period of time later, the information presentation component may stop presenting information suggesting that the power supply amount be reduced.

With this configuration, if the current power supply amount is excessive, but the power supply amount will be deficient between the current time and a specific period of time later, it is not suggested that the power supply amount be reduced. Accordingly, the user can eliminate the waste of performing both an increase and a reduction of the power supply amount within a specific period of time according to the suggestion.

With the excess/deficiency determination device pertaining to one or more embodiments of the present invention, when it has been determined that the current power supply amount is excessive, if the power supply amount is reduced so as to decrease this excess, the excess/deficiency determination prediction component further determines whether or not the power supply amount will be deficient between the current time and a specific period of time later. Also, if the current power supply amount is excessive and the power supply amount is reduced so as to decrease this excess, and the excess/deficiency determination prediction component has determined that the power supply amount will be deficient between the current time and a specific period of time later, the information presentation component may present information suggesting that the power supply amount be reduced.

With this configuration, if the current power supply amount is excessive, but the power supply amount has been reduced (so as to decrease the excess, that is, so that the power supply amount will be closer to the power demand), it is not suggested that the power supply amount be reduced if the power supply amount is deficient between the current time and a specific period of time later. Accordingly, the user can eliminate the waste of performing both an increase and a reduction of the power supply amount within a specific period of time according to the suggestion.

One or more embodiments of the present invention allow a battery swap system to provide a power supply amount with little excess or deficiency with respect to the power demand.

BRIEF DESCRIPTION OF THE DRAWINGS

FIG. 2 is an example of battery data stored in a storage component provided in a power supply management device pertaining to one or more embodiments;

DETAILED DESCRIPTION

One or more embodiments of the present invention will now be described in detail.

Power Supply Management Device 1

Figure 1:
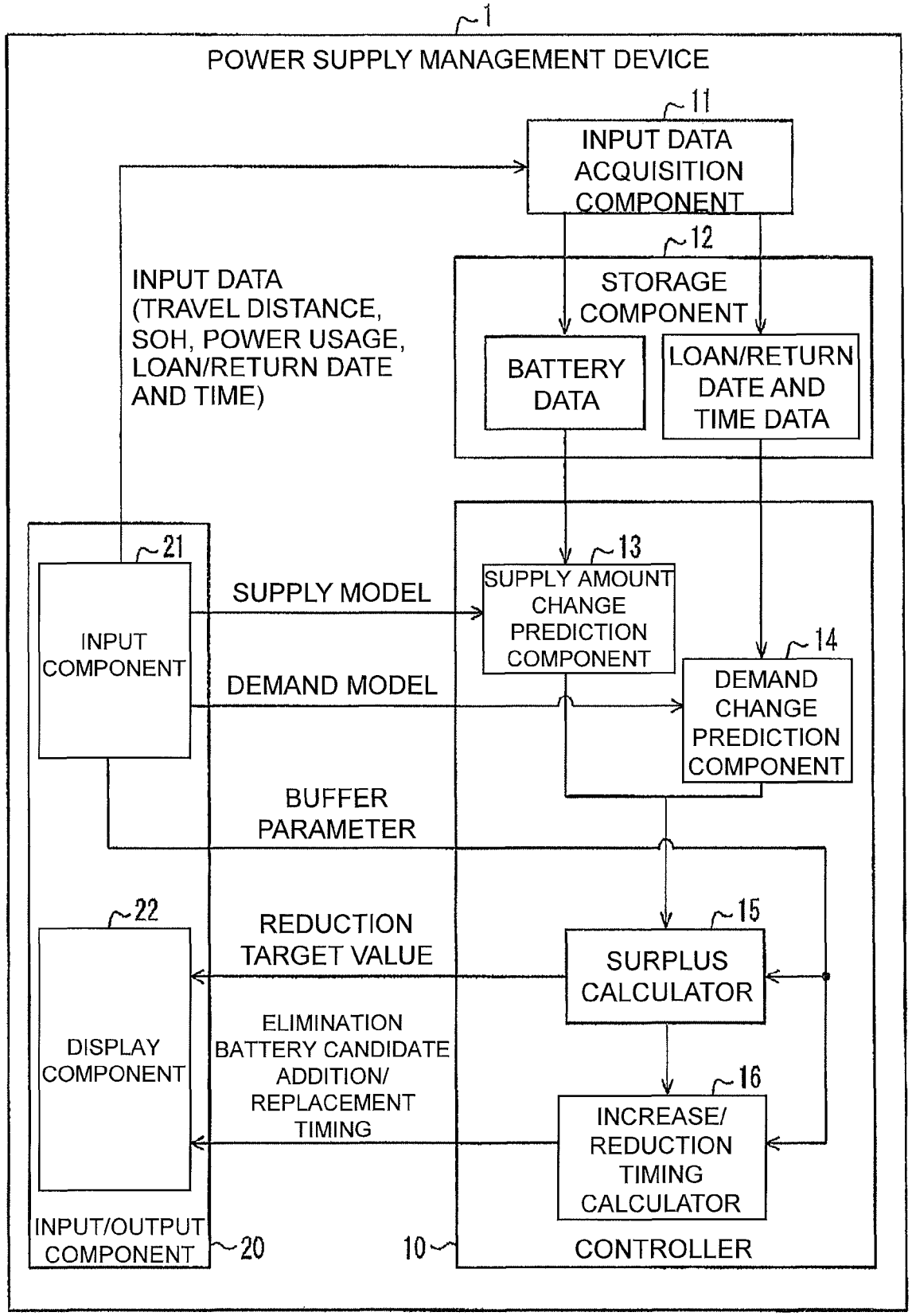
FIG. 1 is a block diagram showing the configuration of a power supply management device pertaining to one or more embodiments.

The configuration of the power supply management device 1 pertaining to one or more embodiments will be described through reference to FIG. 1. FIG. 1 is a block diagram of the configuration of the power supply management device 1. As shown in FIG. 1, the power supply management device 1 comprises a controller 10 (excess/deficiency determination device), an input data acquisition component 11, a storage component 12, and an input/output component 20.

The power supply management device 1 is a device that manages the power supply amount provided by a battery swap system (hereinafter abbreviated as "system"). The power supply management device 1 determines whether or not the surplus power supply amount with respect to the power demand is within an appropriate range (that is, is not excessive), and presents information for adjusting the power supply amount provided by the system.

More specifically, when the surplus of the power supply amount with respect to the power demand is not within an appropriate range, the power supply management device 1 presents a reduction target for the power supply amount. Consequently, the user of the power supply management device 1 can remove (discard) a battery provided to the system in order to achieve the reduction target for the power supply amount.

On the other hand, if the surplus is within an appropriate range, the power supply management device 1 suggests the timing at which the power supply amount should be increased. This allows the user to add a battery to the system or replace the battery in the system at the suggested timing.

Input Data Acquisition Component 11, Storage Component 12

The input data acquisition component 11 acquires input data indicating the usage state (usage history) of a plurality of batteries from an input component 21 of the input/output component 20. The input data includes data indicating "travel distance" of a plurality of batteries, used power, history of SOH (state of health), power usage amount (from loan to return), and loan/return date and time. Here, the "travel distance" of a battery means the cumulative travel distance of the electric car in which that battery is installed.

The input data acquisition component 11 stores data indicating "travel distance," used power, and SOH (state of health) for a plurality of batteries as battery data in the storage component 12. Also, data indicating the loan/return date and time and the power usage amount of a plurality of batteries is stored in the storage component 12 as loan/return date and time data.

Battery Data, Loan/Return Date and Time Data

FIG. 2 shows an example of battery data stored in the storage component 12. The battery data shown in FIG. 2 includes information indicating the IDs, the rated power, and the SOH history (SOH in each of the months up to December) for a plurality of batteries. Although not depicted, the battery data may include "travel distance" data.

Figures 3, 4:
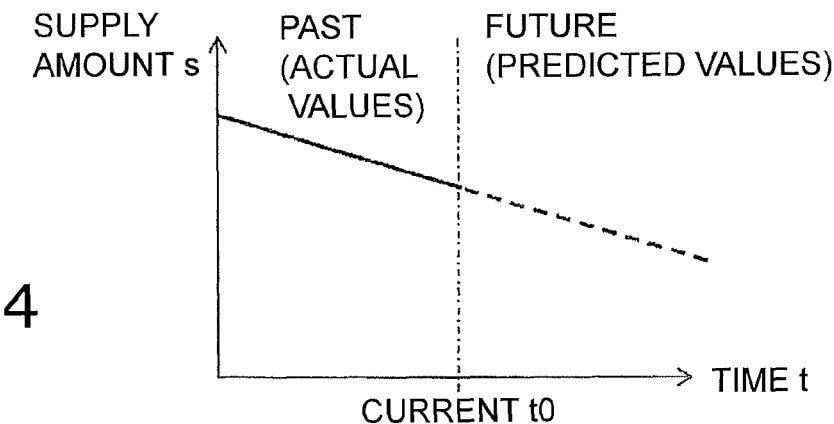
FIG. 3 is an example of loan/return date and time data stored in the storage component provided in the power supply management device pertaining to one or more embodiments.
FIG. 4 is a graph of the power supply amount calculated by a supply amount change prediction component provided in the power supply management device pertaining to one or more embodiments.

FIG. 3 shows an example of loan/return date and time data stored in the storage component 12. The loan/return date and time data shown in FIG. 3 includes information indicating the IDs, the loan date and time, the return date and time, and the power usage amount for a plurality of batteries.

Controller 10

As shown in FIG. 1, the controller 10 includes a supply amount change prediction component 13 (supply amount prediction component), a demand change prediction component 14 (demand prediction component), a surplus calculator 15 (excess/deficiency determination prediction component), and an increase/reduction timing calculator 16 (information presentation component). The various components of the controller 10 determine whether there is an excess or a deficiency of the power supply amount in the system. If there is excess or deficiency of the power supply amount with respect to the power demand, supply adjustment suggestion processing is executed to suggest adjusting (reducing or increasing) the power supply amount. The flow of the supply adjustment suggestion processing will be discussed below.

Supply Amount Change Prediction Component 13

The supply amount change prediction component 13 uses the battery data (see FIG. 2) acquired from the storage component 12 to predict the power supply amount between the current time and a specific period of time later. The supply amount change prediction component 13 at this point takes into account the decrease in the full-charge capacity due to deterioration of the batteries.

More precisely, the supply amount change prediction component 13 selects SOH history data for each battery from the battery data. Then, a function expressing the power supply amount model for the batteries is fitted to the SOH history data for the batteries. Each of the plurality of functions thus obtained expresses the power supply amount of one battery. The supply amount change prediction component 13 adds up these functions to calculate a function $s(t)$ (hereinafter referred to as a power supply total amount $s(t)$) expressing the sum total of the power supply amounts for all the batteries loaned out by the system (overall full-charge capacity).

Alternatively, the supply amount change prediction component 13 may fit a function expressing the power supply amount model for the batteries to the history data of the overall power supply amount (the "supply amount total" in FIG. 2) for all the batteries loaned out by the system. Consequently, the supply amount change prediction component 13 can calculate the power supply amount $s(t)$ without using the SOH history data for each battery.

The history data of SOH or "supply amount total" selected from the battery data by the supply amount change prediction component 13 may be history data acquired at any time. For example, the supply amount change prediction component 13 may select history data within a specific period from the present (December) (for example, each month from October to December in FIG. 2), or may select history data within a specific period in the past (for example, October and November in FIG. 2).

The power supply amount model may be preset, or a definition of the power supply amount model may be (for example, when the power supply amount $s(t)$ is a multidimensional function, the coefficient and degree of the power supply amount $s(t)$) may be inputted.

FIG. 4 is a graph showing the change in the power supply amount $s(t)$ in one or more embodiments. If we let t0 be the current time, the current value of the power supply amount $s(t)$ is $s(t0)$. Also, the power supply amount $s(t)$ at the future time point T (the amount of power that can be supplied in the future) is calculated by substituting T for the variable t. The power supply amount $s(t)$ shown in FIG. 4 is a so-called linear function. However, there are no particular restrictions on the power supply amount model, so the power supply amount $s(t)$ can also be any of various functions other than a linear function. A specific example of the power supply amount $s(t)$ will be discussed below.

The supply amount change prediction component 13 outputs the power supply amount $s(t)$ expressing the power supply amount model to the surplus calculator 15.

Demand Change Prediction Component 14

The demand change prediction component 14 predicts the power demand from the current time until a specific period of time later by using the loan/return date and time data (see FIG. 3) acquired from the storage component 12 to predict the change in demand. At this point, the demand change prediction component 14 takes into account seasonal fluctuation and changes over time in power demand.

More precisely, the demand change prediction component 14 selects power usage data from the loan/return date and time data. Then, a function f(t) (t is time) expressing a power demand model (hereinafter referred to as the power demand f(t)) is fitted so as to minimize discrepancy from the selected power usage data. The power demand model may be preset, or a definition of this model (for example, when the power demand f(t) is a polynomial function, the coefficient and degree of the power demand f(t)) may be inputted from the input component 21.

Figure 5:
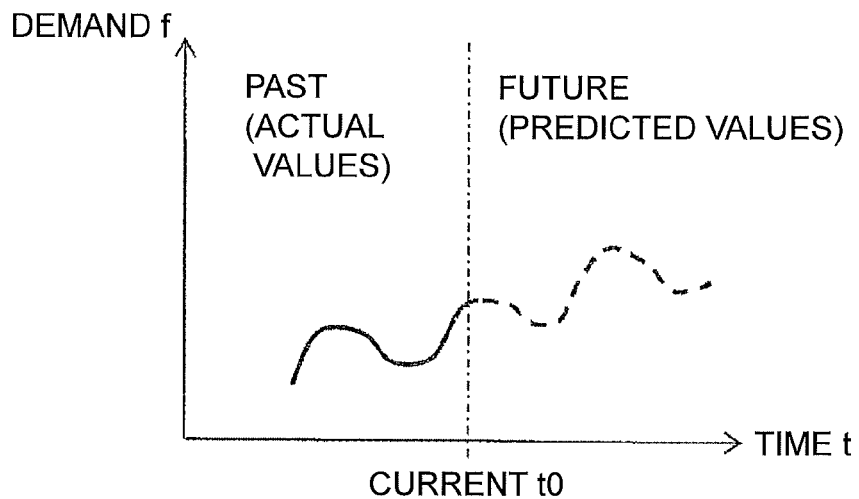
FIG. 5 is a graph of the power demand calculated by a demand change prediction component provided in the power supply management device pertaining to one or more embodiments.

FIG. 5 is a graph showing the change in the power demand f(t) in one or more embodiments. The current value of the power supply amount s(t) is f(t0). Also, the power demand f(t) at the future time point T is calculated by substituting T for the variable t. The method of calculating the power demand f(t) shown in FIG. 5 will be described in detail below.

The demand change prediction component 14 outputs the power demand f(t) expressing the power demand model to the surplus calculator 15.

Surplus Calculator 15

The surplus calculator 15 calculates the surplus Δ(t) of the power supply amount s(t) with respect to the power demand f(t) from the current time until a specific period of time later, on the basis of the future power supply amount s(t) predicted by the supply amount change prediction component 13 and the future power demand f(t) predicted by the demand change prediction component 14.

Figure 6:
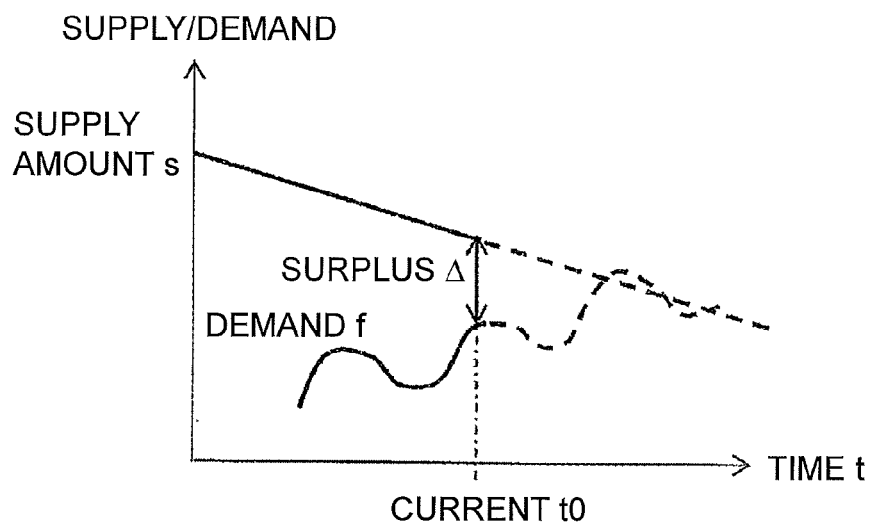
FIG. 6 is a graph in which the graph of the power supply amount shown in FIG. 4 is superimposed with the graph of the power demand shown in one or more embodiments of FIG. 5.

FIG. 6 is a graph in which the power supply amount s(t) shown in FIG. 4 and the power demand f(t) shown in FIG. 5 are superimposed. As shown in FIG. 6, the surplus Δ(t) is the difference f(t)−s(t) between the power supply amount s(t) and the power demand f(t). The current surplus Δ(t0) is calculated by substituting the present time t0 for the variable t of the surplus Δ(t). Also, the surplus Δ(t) at the future time point T is calculated by substituting T for the variable t.

In a modification example, the surplus calculator 15 may calculate the surplus Δ(t) by utilizing a model of a specific power demand instead of the power demand f(t). In this case, the surplus calculator 15 acquires the future power supply amount s(t) from the supply amount change prediction component 13, and calculates the surplus Δ(t) of the power supply amount s(t) with respect to the model of the specific power demand. For example, a model of a specific power demand may be decided on the basis of the power demand in the past. Also, the definition of the model of specific power demand may be inputted from the input component 21.

The surplus calculator 15 outputs the calculated surplus Δ(t) to the increase/reduction timing calculator 16.

Increase/Reduction Timing Calculator 16

The increase/reduction timing calculator 16 determines whether or not the surplus Δ(t)=f(t)−s(t) calculated by the surplus calculator 15 is appropriate (not excessive). More precisely, the increase/reduction timing calculator 16 determines whether or not the surplus Δ(t) is at or under a threshold. Here, the threshold may be the average value, the minimum value, or the maximum value of the surplus Δ(t) in a specific period.

In the case of (A), when the current surplus Δ(t0) is excessive, that is, when the surplus Δ(t0) is over the threshold, the increase/reduction timing calculator 16 may make a presentation to the user suggesting that the power supply amount s(t) be reduced (or the battery removed).

Again in the case of (B), when there is a possibility that the surplus Δ(t) will become excessive in a certain period in the future (or within a specific period from the present), the increase/reduction timing calculator 16 may make a presentation to the user suggesting that the power supply amount s(t) be reduced (or the battery removed).

More specifically, the increase/reduction timing calculator 16 presents information indicating the batteries to be removed (removal battery candidates) (such as the IDs of removal battery candidates). For example, a removal battery candidate may be a battery with the lowest current SOH (as of December) among the batteries listed in the battery data shown in FIG. 2. When the user removes a removal battery candidate (or another battery) from the system, the ID of the removed battery is inputted via the input component 21. Although not depicted, when there is a possibility that the surplus Δ(t) will become excessive (case of (B) above) in the future (or within a specific period from the present), the increase/reduction timing calculator 16 may present information indicating the removal battery candidates.

Figure 7:
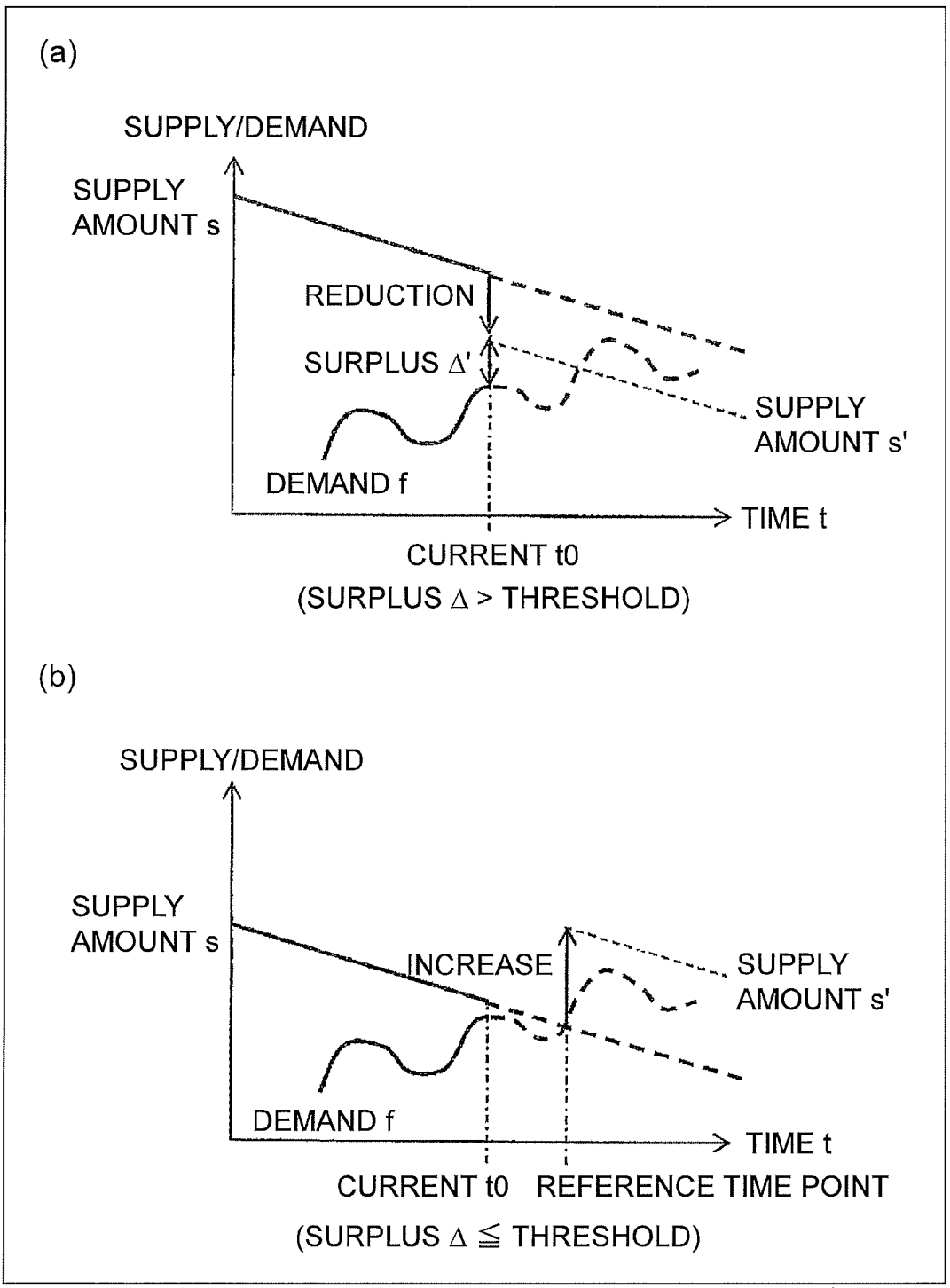
FIG. 7a is a graph of one or more embodiments when the surplus supply amount with respect to the demand exceeds a threshold.
FIG. 7b is a graph of one or more embodiments when the surplus supply amount with respect to the demand is at or below the threshold.

FIG. 7a is a graph of the power supply amount s(t) and the power demand f(t) when the current surplus Δ(t0) is not appropriate (that is, when the surplus Δ(t0) exceeds the threshold).

As shown in FIG. 7a, when a removal battery candidate (or another battery) is removed from the system, the power supply amount s(t) is reduced. In this case, the supply amount change prediction component 13 recalculates the reduced power supply amount s'(t). Also, the surplus calculator 15 uses the reduced power supply amount s'(t) and the power demand f(t) to recalculate the current surplus Δ'(t0). When the surplus Δ'(t0) exceeds the threshold, the increase/reduction timing calculator 16 presents the removal battery candidates again.

In the case of (A'), when the current surplus Δ(t0) is excessive, but the period until the surplus Δ(t) becomes deficient (drops to zero) is less than or equal to a specific time period, the increase/reduction timing calculator 16 may cancel the presentation of the battery addition/replacement period. Alternatively, in the same case, the increase/reduction timing calculator 16 may present the battery addition/replacement period and also present a message to the effect that "there is the possibility that the surplus Δ(t) will temporarily become excessive at some point between now and the time when the surplus Δ(t) next drops to zero.

With this configuration, the user can take into account the fact that the surplus Δ(t) will temporarily be excessive, in deciding whether to remove a removal battery candidate (or other battery) from the system.

Also, in the case of (C), when the current surplus Δ(t0) is appropriate, that is, when the surplus Δ(t0) is at or under the threshold, the increase/reduction timing calculator 16 presents to the user a suggestion that the power supply amount s(t) be increased (or batteries be added or replaced) before the surplus Δ(t) drops to zero (the reference point in time in FIG. 7b).

More specifically, the increase/reduction timing calculator 16 presents information indicating the timing (battery addition/replacement timing) at which batteries should be added or replaced. The battery addition/replacement timing should be before a deficiency occurs in the power supply amount s(t) with respect to the power demand f(t).

FIG. 7b is a graph of the power supply amount s(t) and the power demand f(t) when the current surplus Δ(t0) is appropriate (that is, when the surplus Δ(t0) is at or under the threshold).

As shown in FIG. 7b, at the reference time point when the surplus Δ(t) next drops to zero, batteries in the system are added or replaced. Alternatively, the timing of the addition or replacement of batteries may be the point at which the surplus Δ(t) reaches a specific value, or a point that is a specific length of time earlier than the point at which the surplus Δ(t) next drops to zero. In the latter configuration, a buffer parameter (see FIG. 1) indicating a specific value or a specific period is inputted from the input component 21.

In the case of (C'), when the current surplus Δ(t0) is excessive, but the surplus Δ(t) will become deficient (zero) within a specific time period from now, the increase/reduction timing calculator 16 may stop the presentation of the removal battery candidates.

With the above configuration, in the case of (C'), the user is not prompted to remove the removal battery candidates (or other batteries). Therefore, there is no need to add another battery immediately after the user removes the battery.

In addition, in the case of (C"), when the current surplus Δ(t0) is excessive, but if the removal battery candidates are removed from the system, the surplus Δ(t) will become deficient (drop to zero) within a specific period of time from now, then the increase/reduction timing calculator 16 may stop the presentation of the removal battery candidates. With the above configuration, in the case of (C"), the user is not prompted to remove the removal battery candidates (or other batteries). Therefore, just as in the above case of (C'), there is no need to add another battery immediately after the user removes a battery.

Supply Adjustment Suggestion Processing

Figure 8:
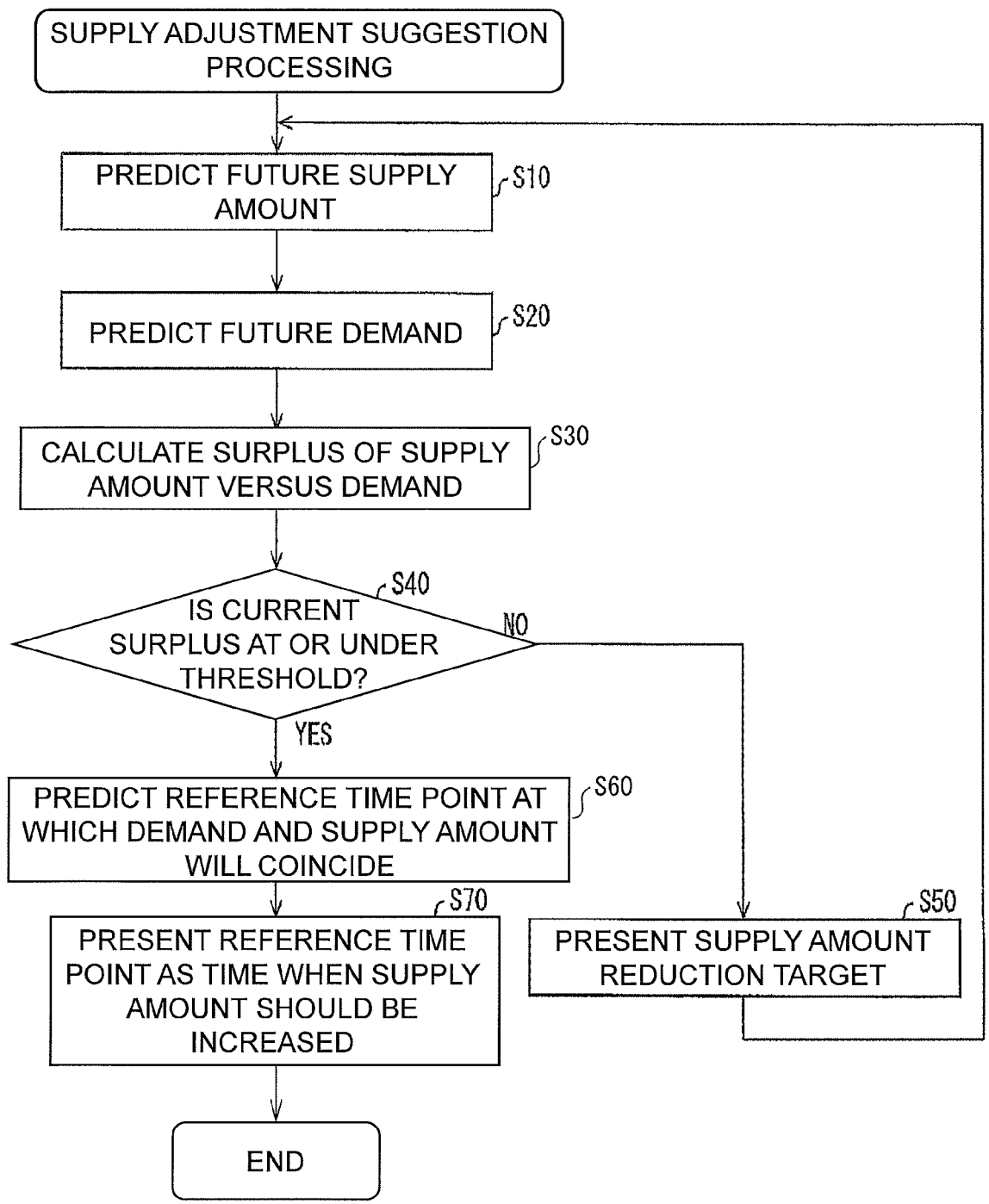
FIG. 8 is a flowchart showing the flow of supply adjustment suggestion processing executed by controller provided in the power supply management apparatus pertaining to one or more embodiments.

The flow of the supply adjustment suggestion processing executed by the controller 10 will be described through reference to FIG. 8. FIG. 8 is a flowchart showing the flow of the supply adjustment proposal processing.

As shown in FIG. 8, in the supply adjustment suggestion processing, the supply amount change prediction component 13 first predicts the future supply amount by calculating the power supply amount s(t) (see FIG. 4) (S10, supply amount prediction step). Also, the demand change prediction component 14 predicts the future demand by calculating the power demand f(t) (see FIG. 5) (S20, demand prediction step). After this, the surplus calculator 15 calculates the surplus Δ(t) (see FIG. 6) of the power supply amount s(t) with respect to the power demand f(t) (S30, excess/deficiency determination prediction step).

Next, the increase/reduction timing calculator 16 determines whether or not the current surplus Δ(t0) (in a modification example, the future surplus Δ(t)) is at or under a threshold (S40, excess/deficiency determination prediction step). If the current surplus Δ(t0) is not at or under the threshold (No in S40), the increase/reduction timing calculator 16 presents the difference between the surplus Δ(t0) and the threshold (in a modification example, the future surplus Δ(t)) as the reduction target value for the power supply amount s(t) (see FIG. 1) (S50). After this, the supply adjustment suggestion processing returns to S10.

On the other hand, when the current surplus Δ(t0) (or the future surplus Δ(t)) is at or under the threshold (Yes in S40), the increase/reduction timing calculator 16 predicts a reference time point (see FIG. 7b) at which the power demand f(t) and the power supply amount s(t) will coincide (S60). The increase/reduction timing calculator 16 then presents the reference time point as the time when the power supply amount s(t) should be increased (S70). This concludes the supply adjustment suggestion processing.

Example of Power Supply Amount s(t)

The power supply amount s(t) expressing the above-mentioned power supply amount model may be a linear function or any multi-dimensional polynomial, or may be a logarithmic function or exponential function. For example, the power supply amount s(t) may be one of the following equations s1(t) to s3(t) (the variable t is time).

$$s1(t) = at + b$$

$$s2(t) = at^2 + bt + c$$

$$s3(t) = at^3 + bt^2 + ct + d \qquad \text{Mathematical Formula 1}$$

Equation s1(t) is the general format of the power supply amount s(t) when the power supply amount model is expressed by a linear function, while equations s2(t) and s3(t) are the general format of the power supply amount s(t) when the power supply amount model is expressed by a quadratic function and a cubic function, respectively. Since the power supply amount s(t) in this embodiment (see FIG. 4) is a linear function, it is expressed by Equation s1(t).

Method for Calculating Power Demand f(t)

The method for calculating the above-mentioned power demand f(t) will be described. Here, it is assumed that the power demand f(t) generally depends only on changes over time and seasonal fluctuations. In this case, the power demand f(t) is expressed by the following equations including a seasonal variation function g(t) and a change over time function h(t).

Mathematical Formula 2

$$f(t) = g(t) + h(t)$$

$$h(t) = mt + n$$

$$g(t) = \begin{cases} g_1(t) = a_1(t \bmod 12) + b_1 & \text{(January to March)} \\ g_2(t) = a_2(t \bmod 12) + b_2 & \text{(April to June)} \\ g_3(t) = a_3(t \bmod 12) + b_3 & \text{(July to September)} \\ g_4(t) = a_4(t \bmod 12) + b_4 & \text{(October to December)} \end{cases}$$

The change over time function h(t) expresses a model of changes in demand over time, and the seasonal fluctuation function g(t) expresses a model of seasonal fluctuations in demand. The change over time function h(t) is a linear function, and the parameters m and n are constants. The seasonal fluctuation function g(t) is expressed by different equations $g_1(t)$ to $g_4(t)$ for each season (January to March, April to June, July to September, and October to December). In equations $g_1(t)$ to $g_4(t)$, the parameters $a_1$ to $a_4$ are any function (such as a quadratic function), and the parameters $b_1$ to $b_4$ are constants.

Figure 9:
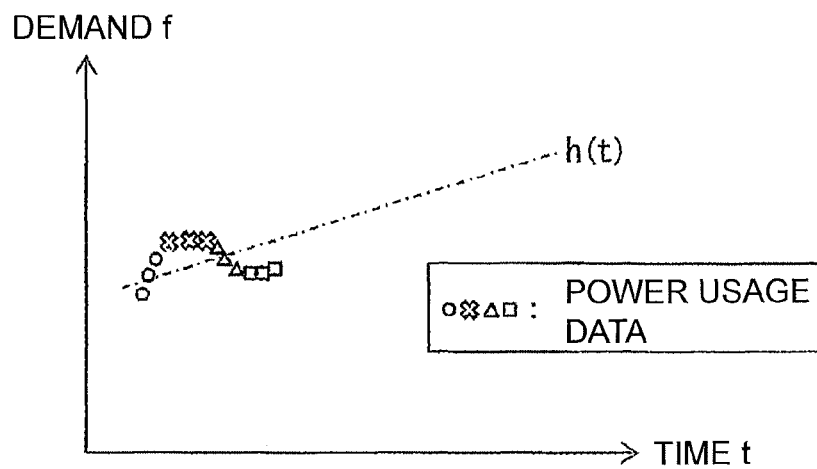
FIG. 9a shows one or more embodiments of a method for calculating age change included in the change in the power demand.
FIG. 9b shows one or more embodiments of a method for calculating seasonal fluctuation included in the power demand.
Figure 9:
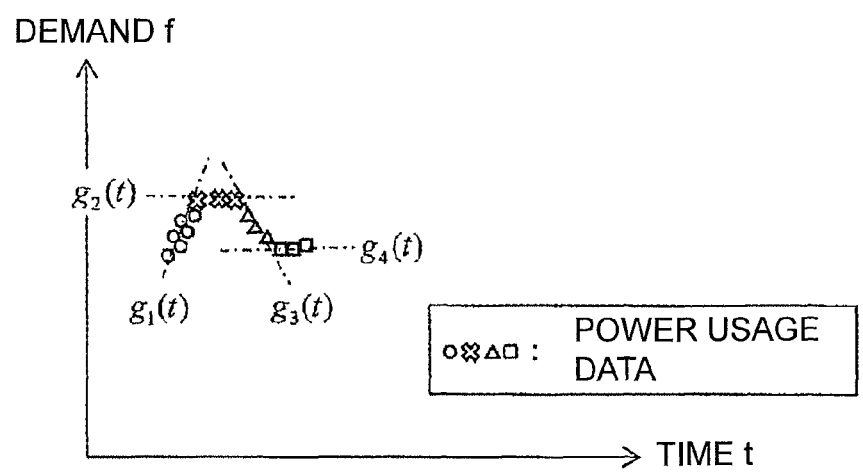

The method for calculating the change over time function h(t) and the seasonal fluctuation function g(t) will be described through reference in FIGS. 9a and 9b. FIG. 9a shows the method for calculating the change over time function h(t), and FIG. 9b shows the method for calculating equations $g_1(t)$ to $g_4(t)$ of the seasonal fluctuation function g(t).

As shown in FIG. 9a, the demand change prediction component 14 fits the change over time function h(t), which expresses a model of the change in demand over time, so as to minimize the discrepancy from the power usage data (see FIG. 3). This determines the parameters m and n of the change over time function h(t). Next, the demand change prediction component 14 divides the value expressed by the change over time function h(t) from the power usage data. Consequently, the tendency caused by change over time is excluded from the power usage data, so basically just the tendency due to seasonal fluctuation remains in the power usage data (from which the tendency due to change over time has been removed).

As shown in FIG. 9(b), the demand change prediction component 14 fits the seasonal fluctuation function g(t) expressing a model of seasonal fluctuations in demand so as to minimize the discrepancy from the power usage data (from which the tendency due to change over time has been removed). Here, in the period from January to March, the seasonal fluctuation function g(t) is expressed by equation $g_1(t)$. In view of this, the demand change prediction component 14 fits the equation $g_1(t)$ so as to minimize the discrepancy from the power usage data included in the period from January to March (in FIG. 9b, the data indicated by circles). This determines the parameters $a_1$ and $b_1$ in the equation $g_1(t)$. By the same procedure, the parameters $a_2$ and $b_2$ in the equation $g_2(t)$ are determined using the power usage data included in the period from April to June (in FIG. 9b, the data indicated by Xs). Also, the parameters $a_3$ and $b_3$ in the equation $g_3(t)$ are determined using the power usage data included in the period from July to September (in FIG. 9b, the data indicated by triangles). The parameters $a_4$ and $b_4$ in the equation $g_4(t)$ are determined using the power usage data included in the period from October to December (in FIG. 9b, the data indicated by squares).

One or More Other Embodiments (A)

In one or more embodiments, an example was described in which the power supply management device 1 was used as a device for managing the power supply amount, which is provided by a battery swap system that loans out, charges, etc., a plurality of batteries, but the embodiments of the present invention are not limited to or by this.

For example, the excess/deficiency determination device of embodiments of the present invention may be installed in a battery station in which a plurality of chargers are installed, rather than just one power supply management device, and these batteries are loaned out, charged, etc.

(B)

In one or more embodiments, no specific examples are given of the power consuming units in which the plurality of batteries loaned out from this system are installed.

Applications of the batteries loaned out from the system include, for example, electric cars (EVs), electric motorcycles, electric unicycles, electric bicycles, motor-assisted bicycles, and PHVs (plug-in hybrid vehicles), and other such vehicles.

Also, the power consuming unit in which the battery is installed is not limited to a vehicle, and may also be other electrical products that are driven by exchangeable batteries.

Examples of these electrical products include refrigerators, washing machines, vacuum cleaners, rice cookers, electric kettles, and other such household appliances that run on power from a battery.

Furthermore, the power consuming unit in which the battery is installed may be a power tool.

In this case, the battery used in the power tool may be charged at a battery station or the like where a plurality of batteries that can be loaned out are charged.

Example of Implementation by Software

The controller 10 of the power supply management device 1 may be realized by a logic circuit (hardware) formed on an integrated circuit (IC chip) or the like, or it may be realized by software using a CPU (central processing unit).

In the latter case, the power supply management device 1 comprises a CPU that executes the commands of a program, which is software for carrying out various functions, a ROM (read only memory) or a storage device (these are referred to as "recording media") in which the above-mentioned program and various kinds of data are recorded so as to be readable by a computer (or CPU), a RAM (random access memory) for developing the program, etc. The computer (or CPU) then reads the program from the recording medium and executes the program. The recording medium can be a "non-transitory tangible medium," such as a tape, disk, card, semiconductor memory, or programmable logic circuit. Also, the above-mentioned program may be supplied to the computer via any transmission medium capable of transmitting the program (a communication network, a broadcast wave, etc.). One or more embodiments of the present invention can also be realized in the form of a data signal embedded in a carrier wave, in which the program is embodied by electronic transmission.

The present invention is not limited to or by the above embodiments, and various modifications are possible within the scope of the claims. Embodiments obtained by suitably combining the technological means disclosed in different embodiments are also encompassed by the technological scope of the present invention. Although the disclosure has been described with respect to a limited number of embodiments, those skilled in the art, having the benefit of this disclosure, will appreciate that various other embodiments may be devised without departing from the scope of the present invention.

INDUSTRIAL APPLICABILITY

One or more embodiments of the present invention can be utilized in an excess/deficiency determination device that predicts power demand in a battery swap system.

REFERENCE SIGNS LIST 10 controller (excess/deficiency determination device)
13 supply amount change prediction component (supply amount prediction component)
14 demand change prediction component (demand prediction component)
15 surplus calculator (excess/deficiency determination prediction component)
16 increase/reduction timing calculator (information presentation component)

The invention claimed is:

1. An excess/deficiency determination device that performs excess/deficiency determination in a system for managing and loaning out a plurality of batteries, about an amount of power that can be supplied by the plurality of batteries managed by the system, the excess/deficiency determination device comprising:
a controller coupled to a memory that determines a power demand from a current time until a specific period of time later selecting power usage data from loan/return date and time data of the battery as information indicating a usage history of each battery by fitting a function f(t), where t is time, expressing a power demand model so as to minimize discrepancy from the selected power usage data;

the controller further determines the amount of power that can be supplied by the batteries from the current time until a specific period of time later, from a change in a full-charge capacity of each battery based on the deterioration of each battery, or from a change in a total full-charge capacity of the plurality of batteries based on a deterioration of each battery; and the controller further determines whether there is an excess or a deficiency in the amount of power that can be supplied as predicted by the controller, with respect to the power demand predicted by the controller, between the current time and a specific period of time later.

2. The excess/deficiency determination device according to claim 1, wherein the controller further presents information suggesting that a power supply amount be reduced when the controller has determined that there is an excess of power that can be supplied between the current time until a specific period of time later.

3. The excess/deficiency determination device according to claim 1, wherein the controller further presents information suggesting that a power supply amount be increased when the controller has determined that there is a deficiency of power that can be supplied in the future, between the current time and a specific period of time later.

4. The excess/deficiency determination device according to claim 2, wherein the controller further determines whether or not a current power supply amount is excessive with respect to a current power demand, and if the controller has determined that the current power supply amount is excessive, the controller presents information suggesting that the power supply amount be reduced.

5. The excess/deficiency determination device according to claim 4, wherein the controller further determines whether or not the power supply amount is deficient between the current time and a specific period of time later, when the current power supply amount has been determined to be excessive, and when the controller has determined that the current power supply amount is excessive, and that the power supply amount will be deficient between the current time and a specific period of time later, the controller stops presenting information suggesting that the power supply amount be reduced.

6. The excess/deficiency determination device according to claim 4, wherein the controller further determines whether or not the power supply amount will be deficient between the current time and a specific period of time later if the power supply amount is reduced so as to decrease the excess when the current power supply amount has been determined to be excessive, and if the controller has determined that the current power supply amount is excessive, and that the power supply amount will be deficient between the current time and a specific period of time later if the power supply amount is reduced so as to decrease the excess, the controller stops presenting information suggesting that the power supply amount be reduced.

7. A non-transitory computer-readable recording medium on which a control program is recorded, and the control program for causing a computer to function as the excess/deficiency determination device according to claim 1, wherein the control program causes the computer to function as the controller.

8. The excess/deficiency determination device according to claim 3, wherein the controller further determines whether or not a current power supply amount is excessive with respect to a current power demand, and if the controller has determined that the current power supply amount is excessive, the controller presents information suggesting that the power supply amount be reduced.

9. A method for controlling an excess/deficiency determination device that performs excess/deficiency determination in a system for managing and loaning out a plurality of batteries, about an amount of power that can be supplied by the plurality of batteries managed by the system, the method comprising:

determining a power demand from a current time until a specific period of time later selecting power usage data from loan/return date and time data of the battery as by using information indicating a usage history of each battery by fitting a function f(t), where t is time, expressing a power demand model so as to minimize discrepancy from the selected power usage data;

determining the amount of power that can be supplied by the batteries from the current time until a specific period of time later, from a change in the full-charge capacity of each battery based on a deterioration of each battery, or from a change in the total full-charge capacity of the plurality of batteries based on the deterioration of each battery; and determining whether there is an excess or a deficiency in the amount of power that can be supplied as predicted in the supply amount prediction step, with respect to the power demand predicted in the demand prediction step, between the current time and a specific period of time later.

* * * * *